United States Patent [19]

Brancaleoni et al.

[11] Patent Number: 5,391,258
[45] Date of Patent: Feb. 21, 1995

[54] COMPOSITIONS AND METHODS FOR POLISHING

[75] Inventors: Gregory Brancaleoni, Newark, Del.; Lee M. Cook, Steelville, Pa.

[73] Assignee: Rodel, Inc., Newark, Del.

[21] Appl. No.: 67,234

[22] Filed: May 26, 1993

[51] Int. Cl.$^6$ .......................................... H01L 21/306
[52] U.S. Cl. ................................. 156/636; 437/228
[58] Field of Search .................. 156/636; 437/228; 51/281 R, 283 R; 252/79.1

[56] References Cited

U.S. PATENT DOCUMENTS

| | | | |
|---|---|---|---|
| T105,402 | 5/1985 | Basi et al. | 156/636 |
| 4,117,093 | 9/1978 | Brunner et al. | |
| 4,169,337 | 10/1979 | Payne | 51/283 R |
| 4,238,275 | 12/1980 | Shih | 156/662 |
| 4,332,649 | 6/1982 | Sälzle | 156/663 |
| 4,702,792 | 10/1987 | Chow et al. | 156/636 |
| 4,867,757 | 9/1989 | Payne | 51/293 |
| 4,944,836 | 7/1990 | Beyer et al. | 156/645 |
| 4,954,142 | 9/1990 | Carr et al. | 51/309 |
| 4,956,313 | 9/1990 | Cote et al. | 156/636 |
| 4,959,113 | 9/1990 | Roberts | 156/636 |
| 4,968,381 | 11/1990 | Prigge et al. | 156/636 |
| 4,992,135 | 2/1991 | Doan | 156/636 |
| 5,051,134 | 9/1991 | Schnegg et al. | 156/662 |
| 5,244,534 | 9/1993 | Yu | 156/636 |

FOREIGN PATENT DOCUMENTS 3-256665 11/1991 Japan .

OTHER PUBLICATIONS

Translation of Otsuka et al. (JP3-256665).
R. B. Heimann, "Carbon Trapped in Thin Oxide Films Produced During Polishing . . . " Chemie-Ingenieur-Technik, vol. 59, No. 5, 1987 pp. 427-429.
Rodel, Surface Tech Review, vol. 1, Issue 5, Rodel Products Corporation, Oct. 1988, pp. 1-4.
C. W. Kaanta et al., "Dual Damascene: A ULSI Wiring Technology", 1991 VMIC Conference, Jun. 11-12, 1991, IEEE, pp. 144-152.
Cook, "Chemical Processes in Glass Polishing", Journal of Non-Crystalline Solids 120 (1990) pp. 156-165.
Bacon & Raggon, "Promotion of Attack on Glass and Silica by Citrate and Other Anions in Neutral Solution", J. Amer. Ceram. Soc. vol. 42, pp. 199-205 (1959).
Ernsberger, "Attack of Glass by Chelating Agents", J. Amer. Ceram. Soc., vol. 42, pp. 373-375 (1959).

Primary Examiner—Tom Thomas
Assistant Examiner—Lynne A. Gurley
Attorney, Agent, or Firm—Kenneth A. Benson

[57] ABSTRACT

Improved compositions for polishing silicon, silica or silicon-containing articles is provided which consists of an aqueous medium, abrasive particles and an anion which controls the rate of removal of silica. The anion is derived from a class of compounds which contain at least two acid groups and where the pKa of the first dissociable acid is not substantially larger than the pH of the polishing composition. Methods using the composition to polish or planarize the surfaces of work pieces, as well as products produced by such methods, are also provided.

16 Claims, No Drawings

COMPOSITIONS AND METHODS FOR POLISHING

BACKGROUND OF THE INVENTION

1. Field of the Invention

The invention relates to the polishing of glasses, semiconductors, dielectric/metal composites and integrated circuits. More particularly, this invention relates to improvements in the surface preparation of composite materials where improved differences in rate between silica and other components are desired.

2. Description of the Prior Art

Conventional polishing compositions or slurries generally consist of a solution which contains abrasive particles. The part, or substrate is bathed or rinsed in the slurry while an elastomeric pad is pressed against the substrate and rotated so that the slurry particles are pressed against the substrate under load. The lateral motion of the pad causes the slurry particles to move across the substrate surface, resulting in wear, volumetric removal of the substrate surface.

In many cases the rate of surface removal is determined solely by the degree of applied pressure, the velocity of pad rotation and the chemical activity of the slurry particle. Thus, as reviewed by Cook [J. Non-Cryst. Solids, 1990], slurry particles with a high degree of chemical activity toward the substrate (e.g., $CeO_2$ toward $SiO_2$) show significantly higher polishing rates than more inert particles (e.g. $La_2O_3$ toward $SiO_2$). This enhancement of chemical activity of the polishing particle has been the basis of numerous patents, for example U.S. Pat. No. 4,959,113.

An alternative means of increasing polishing rates is to add components to the slurries which by themselves are corrosive to the substrate. When used together with abrasive particles, substantially higher polishing rates may be achieved. This process, often termed chemomechanical polishing (CMP) is a preferred technique for polishing of semiconductors and semiconductor devices, particularly integrated circuits. Examples of such CMP processes for enhanced polishing of silicon wafer surfaces have been disclosed by Payne in U.S. Pat. No. 4,169,337. Beyer et al. (U.S. Pat. No. 4,944,836) and Chow et al. (U.S. Pat. No. 4,702,792) teach the utility of CMP in improving rate selectivity in the polishing of dielectric/metal composite structures such as interconnect vias in integrated circuit structures. Specifically they teach the introduction of additives which accelerate dissolution of the metal component. The purpose of this and other related techniques is to preferentially remove the metal portion of the circuit so that the resulting surface becomes coplanar. The process is ordinarily termed planarization.

It is highly desirable to improve the selectivity of metal planarization as much as possible. Carr et al. (U.S. Pat. No. 4,954,142) teach further improvements in CMP planarization of dielectric/metal composite structures by addition of a chelating agent to the slurry which is selective for the metal component of interest. This results in a further increase of the corrosion rate of the metal phase and increase selectivity of metal versus dielectric phase removal, making the planarization process much more efficient.

A number of anions have been demonstrated to chelate or complex with $Si^{4+}$ in such a manner as to accelerate corrosion of silica or silicate materials. As described by Bacon and Raggon [J. Amer. Ceram. Soc. vol. 42, pp.199-205, 1959] a variety of weak acids were shown to accelerate the corrosion of silica and silicate glasses in neutral solution (pH~7). The effect was ascribed to the ability of the free anions of the acid (conjugate base) to complex the $Si^{4+}$ cation in much the same manner as the pyrocatechol-silicate complexes described by Rosenheim et al. (A. Rosenheim, B. Raibmann, G. Schendel; Z. anorg. u. allgem. Chem., vol. 196, pp. 160-76, 1931] as shown below:

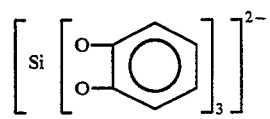

The corrosive anions described by Bacon and Raggon all had similar structures which were in turn closely similar to pyrocatechol (1,2-dihydroxybenzene), namely, all were mono or dicarboxylic acids which had hydroxyl groups at secondary or tertiary carbon sites which were located at an alpha position with respect to the carboxylic acid group. An example of an active versus an inactive compound is shown below:

HOOC—CHOH—CHOH—COOH: Tartaric acid (active) $pKa_1 = 3.02$ versus

HOOC—$CH_2$—$CH_2$—COOH: Succinic acid (inactive) $pKa_1 = 4.2$ The pKa is the logarithm of the association constant Ka for formation of the free anion, as defined by the reaction:

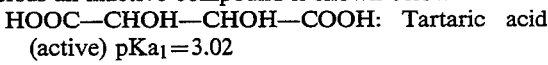

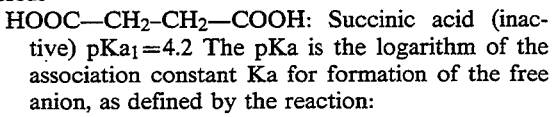

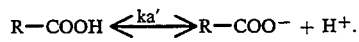

Thus a lower pKa indicates a stonger acid. At equivalent pH a higher conjugate base concentration is found in solution.

Prior art corrosion literature also describes the corrosive effects of catechol in static solution. As shown by Ernsberger (J. Amer. Ceram. Sec., vol. 42, pp.373-5, 1959), addition of pyrocatechol to Ethylene Diamine Tetraacetic Acid (EDTA) solution produces enhanced corrosion of soda-lime-silicate glass in the pH range 10-14. The enhancement was significant with rates at least twice as high as with EDTA alone in the solution. A maximum effect was found at pH 12.5. Once again, the effect was attributed to complexation of free $Si^{4+}$ cation with the catechol.

From the above, it is clear that published literature on the subject indicates that such additives have been shown to be corrosive to Silica or silicates under static exposure. The mode of the corrosion is believed to be the formation of a complex or chelate with free $Si^{4+}$ cations. Thus, in like manner to the teaching of U.S. Pat. No. 4,954,142, a higher silica removal rate during polishing would be expected when such additives are present in the polishing solution. Consequently, these types of additives have never been used in metal planarization, as metal/silica selectivity was expected to be seriously degraded.

While the prior art CMP procedures described above appear attractive, they possess significant drawbacks. Specifically, the etchants incorporated into prior art CMP slurries are isotropic, i.e., they attack all portions of the exposed phase, regardless of position. Thus significant incorporation of etchants into CMP slurries often results in increases in surface roughness and texture when recessed features become etched. In the polishing of integrated circuits this effect is termed dishing and often occurs at the end of the process when a significant portion of the substrate surface is composed of the more durable component. It is highly undesirable, as the object of polishing is to produce a uniform plane surface free from texture.

It is clear from the above discussion that if the polishing rate of the silica phase of a composite structure could be reduced in a controlled manner, selectivity could be significantly improved. This would allow use of solutions which are less aggressive to the other (metal) phase, thus permitting efficient CMP processing of metal/silica composites with reduced dishing.

Accordingly, it is the object of this invention to provide a solution for polishing silicon, silica, silicon- or silica-containing articles wherein the polishing rate of the silicon or silica phase is modulated or controlled by the addition of specific additive or complexing agents.

It is also the object of this invention to provide an improved polishing slurry and polishing method for composite articles which results in improved polishing slurry and polishing method for composite articles which results in improved selectivity during the polishing process, particularly for metal dielectric composites such as those occurring in integrated circuit structures.

These and other objects of the invention will become apparent to those skilled in the art after referring to the following description and examples.

SUMMARY OF THE INVENTION

The object of this invention has been achieved by providing a composition for polishing silicon, silica or silicon-containing articles, including a composite of metal and silica, comprising an aqueous medium, abrasive particles, an oxidizing agent and an anion which suppresses the rate of removal of silica. The anion is derived from a class of compounds which contain at least two acid groups and where the pKa of the first dissociable acid is not substantially larger than the pH of the polishing composition.

DESCRIPTION OF THE INVENTION

In the present invention we have discovered the unexpected ability of a class of compounds to suppress the polishing rate of objects whose surfaces are composed of silicon and silicates. Incorporation of these compounds into a polishing slurry allows control of the polishing rate of said surfaces, thus allowing unprecedented levels of selectivity when said surface is a component of a composite article, e.g., a dielectric/metal composite. What is even more unexpected is that prior art teaches that these same compounds act as accelerants to the corrosion of silica and silicate surfaces under static conditions.

As discussed above, the rate-suppressing compounds in question are those which dissociate in solution to produce free anions of a specific class, said anions are believed to complex or bond to the silicon, silica or silicate surface via interaction with surface hydroxyl groups (Si—OH).

Unexpectedly, we have discovered that the opposite is true; the introduction of this class of anions into the polishing composition actually suppresses the removal of silica during the polishing process. This suppression effect is clearly demonstrated in the examples set forth below.

More specifically, we observe that said anions must have two characteristics simultaneously in order to suppress the $SiO_2$ polishing rate. First, they must have at least two acid groups present in the structure which can effect complexation to the silica or silicate surface, and, second, the pKa of the first acid species must not be substantially larger than the pH of the polishing solution for efficient silica rate suppression to occur. Substantially is herein defined as 0.5 units (pKa or pH).

Acid species are defined as those functional groups having a dissociable proton. These include, but are not limited to, carboxylate, hydroxyl, sulfonic and phosphonic groups. Carboxylate and hydroxyl groups are preferred as these are present in the widest variety of effective species.

The pKa of the first acid species is strongly influenced by structure. It is our finding that a wide variety of additive structures are effective, as long as the two necessary conditions set forth above are met. Particularly effective are structures which possess two or more carboxylate groups with hydroxyl groups in an alpha position, such as straight chain mono- and di-carboxylic acids and salts including, for example, malic acid and malates, tartaric acid and tartrates and gluconic acid and gluconates. Also effective are tri- and polycarboxylic acids and salts with secondary or tertiary hydroxyl groups in an alpha position relative to a carboxylic group such as citric acid and citrates. Also effective are compounds containing a benzene ring such as ortho di- and polyhydroxybenzoic acids and acid salts, phthalic acid and acid salts, pyrocatecol, pyrogallol, gallic acid and gallates and tannic acid and tannates. The reason for the effectiveness of these compounds lies in the extensive electron delocalization observed in the structures. This delocalization leads to a high degree of stability for the conjugate base in solution, as evidenced by the low pKa values:

Tartaric acid: $pKa_1 = 3.02$
Citric acid: $pKa_1 = 3.1$
Phthalic acid: $pKa_1 = 2.95$ The pKa limitations set forth in the present invention are due to the requirement that the free anion or conjugate base must be present in reasonable concentration for the rate suppressing effect to occur. At pH<<pKa little free anion is present. At pH=pKa, the acid is 50% dissociated. At pH>>pKa, essentially all of the acid is present as the anion. Thus the dissociation constant must be chosen to reflect the range of pH values normally encountered in polishing. Ideally, the pH of the polishing composition should be equal to or greater than a value equal to the $pKa_1$ of the additive used for silica rate suppression. If the $pKa_1$ of the additive is substantially greater than the composition pH, insufficient free anion is produced in solution and the suppression effect does not occur. Thus additives such as tartaric, citric and phthalic acid ($pKa \leq 3.1$) should be effective over a pH range corresponding to the normal pH range encountered in polishing silicates (pH~4-11) and would be preferred. In contrast, addition of pyrocatechol ($pKa_1 \sim 10$) would only be useful at very high solution pH, such as might be found in the polishing of Si wafers, and would have a more restricted utility.

Several examples of compositions prepared by the present invention are set forth below in order to demonstrate and clarify the essential features. They are not meant to be restrictive in any way.

EXAMPLE 1

Two polishing compositions were prepared as shown below. The compositions differed only in that the second composition contained 0.3 Molar potassium hydrogen phthalate as an additive introduced to suppress the polishing rate of $SiO_2$. Both compositions were used to polish samples of CVD-deposited tungsten metal film on Si substrates, and thermally grown $SiO_2$ on Si substrates, using identical conditions on a Strasbaugh 6DS polishing machine. Polishing conditions were:
  Pressure: 7 psi
  Spindle speed: 40 rpm
  Platen speed: 50 rpm
  Pad type: Rodel IC1000, 38" diam
  Slurry flow: 150 ml/min
  Temperature: 230° C.
Composition 1
  1000 g submicron alumina slurry (33% solids)
  1000 g $H_2O$
  2000 ml 50% $H_2O_2$
  pH = 5.6
  Polishing rate of W metal = 436 Angstroms/min
  Polishing rate of $SiO_2$ = 140 Angstroms/min
  Selectivity (W/$SiO_2$) = 3.1:1
Composition 2
  1000 g submicron alumina slurry (33% solids)
  1000 g $H_2O$
  2000 ml 50% $H_2O_2$
  221.6 g potassium hydrogen phthalate
  pH = 2.9
  Polishing rate of W metal = 1038 Angstroms/min
  Polishing rate of $SiO_2$ = 68 Angstroms/min
  Selectivity (W/$SiO_2$) = 15.3:1

Addition of the phthalate salt resulted in a reduction of slurry pH to approximately the $pKa_1$ of phthalic acid. The lowered pH led to an increase in the tungsten polishing rate. Phthalate addition resulted in a reduction of the $SiO_2$ polishing rate by a factor of 2. This resulted in a five-fold improvement in the selectivity of removal for tungsten relative to silica, a highly desirable result. In this example, hydrogen peroxide was introduced into the composition to accelerate the removal of tungsten. The high degree of effectiveness of composition 2 at such low pH is surprising. This is in direct opposition to the teaching of U.S. Pat. No. 4,956,313 and U. S. Pat. No. 4,992,135, both of which teach the efficacy of using solution pH above 6 to obtain optimum selectivity for tungsten vs. silica removal. Thus composition no. 2 of this example represents a preferred embodiment of the present invention as it applies to the polishing of metal/-dielectric composites.

EXAMPLE 2

To more clearly show that the rate inhibition of silica was not due to incorporation of hydrogen peroxide, the test of Example 1 was repeated without peroxide addition where an inactive salt (ammonium nitrate) was added in equinormal concentration relative to the phthalate salt. Wafers and polishing conditions were identical to those used in Example 1. As shown below, while tungsten rates were identical, silica rates were depressed by a factor of ~2 when phthalate was added to the composition. In this example, the pH of the phthalate-containing composition is substantially above $pKa_1$.
Composition 3
  1000 g submicron alumina slurry (33% solids)
  3000 g $H_2O$
  177 g $NH_4NO_3$ (0.6 normal)
  pH = 7.6
  Polishing rate of W metal = 71 Angstroms/min
  Polishing rate of $SiO_2$ = 227 Angstroms/min
Composition 4
  1000 g submicron alumina slurry (33% solids)
  3000 g $H_2O$
  221.6 g potassium hydrogen phthalate (0.6 normal)
  pH = 3.6
  Polishing rate of W metal = 71 Angstroms/min
  Polishing rate of $SiO_2$ = 119 Angstroms/min

EXAMPLE 3

In order to demonstrate yet further the effect of anions of the present invention on the rate of silica polishing, varying concentrations of potassium hydrogen phthalate were added to portions of a freshly prepared lot of composition no. 1 above. Wafers and polishing conditions were again the same as in Examples 1 and 2. Test results are summarized below:

TABLE 1

| Test | 1 | 2 | 3 | 4 |
|---|---|---|---|---|
| Moles Potassium hydrogen phthalate added | 0.00 | 0.05 | 0.10 | 0.20 |
| pH | 6.0 | 3.6 | 3.5 | 3.3 |
| W polishing rate Angstroms/min | 444 | 978 | 1164 | 1164 |
| $SiO_2$ polishing rate Angstroms/min | 167 | 137 | 93 | 76 |
| Selectivity (W/$SiO_2$) | 2.7 | 7.1 | 12.5 | 15.3 |

Both tungsten polishing rate, silica polishing rate, and selectivity for the composition without phthalate addition agree well with the data of Example 1. Silica polishing rate decreases directly with increasing phthalate concentration, while the rate of tungsten polishing remains relatively constant at phthalate additions above 0.05 molar. These data are also in good agreement with the data for the phthalate-containing composition no.2 of Example 1. These data clearly indicate that the effect of compositions of the present invention is to suppress the polishing rate of silica with corresponding improvements in polishing selectivity relative to a metal phase. In this example, a critical concentration of ~0.1 molar is required for effectiveness. Additions of compounds above such a critical concentration also represent a preferred embodiment of this invention.

EXAMPLE 4

A portion of composition 2 of Example 1 above was prepared and used to polish samples of both sheet tungsten, sheet $SiO_2$ and samples of integrated circuits. The integrated circuits consisted of a device containing interlevel connections (studs) and a silica dielectric layer covered with approximately 2000 angstroms of tungsten metal. The composition of the sheet wafers was identical to that contained in the integrated circuit. All samples were polished on a Strasbaugh model 6DS planarizer using conditions set forth below:
  Pressure: 7 psi
  Carrier speed: 25 rpm Platen speed: 25 rpm
Pad type: IC-1000
Slurry flow: 100 ml/min Sheet tungsten wafers showed removal rates of 900 Angstroms/min, while the rate for sheet $SiO_2$ was 70 Angstroms/min, giving a selectivity of 12.9:1. This is close to the selectivity observed using the different machine conditions of Example 1. Polishing of the integrated circuit samples was continued until all visible traces of metal coverage had disappeared. Visual observation of metal features after polishing at 50× showed clean lines and studs. No evidence of dishing was observed. The oxide layer looked very smooth, with no evidence of scratches, pits or haze. Examination at 200× showed sharp lines and smooth metal surfaces. No damage to the oxide layer was observed. Measurement of surface topology using a Tencor P1 wafer profilometer indicated that the Total Indicated Runout (TIR) of wafers was between 1200 Angstroms and 4000 Angstroms over a 500 μm scan length, depending on location and feature, indicating that the circuit had been successfully planarized. TIR is the difference between maximum and minimum surface features over the scan length and is a commonly accepted measure of wafer planarity.

We claim:

1. A method of polishing a composite, one component of which is silicon, silica or silicates in which a polishing composition comprising: an aqueous medium, abrasive particles, an oxidizing agent and a compound or compounds which suppress the rate of removal of silica wherein each of said compound or compounds contains at least two acid groups and where the pKa of the first dissociable acid is not substantially larger than the pH Of the polishing composition is used as the polishing slurry.

2. A method according to claim 1 where said compound or compounds which suppress the rate of removal of silica contain a benzene ring.

3. A method according to claim 2 where said composition for polishing consists essentially of water, abrasive particles, hydrogen peroxide and potassium hydrogen phthalate, where the solution concentration of the phthalate component is at least 0.1 molar.

4. A method according to claim 1 where said compound or compounds which suppress the rate of removal of silica are straight chain mono- and di-carboxylic acids and salts which have secondary hydroxyl groups in an alpha position relative to the carboxylate group.

5. A method according to claim 1 where said compound or compounds which suppress the rate of removal of silica are tri- or poly-carboxylic acids and salts which have secondary or tertiary hydroxyl groups in an alpha position relative to a carboxylate group.

6. A method according to claims 1, 2, 5, 6 or 3 wherein an additional component of said composite is tungsten metal.

7. A method according to claims 1, 2, 4, 5 or 3 wherein an additional component of said composite is copper metal.

8. A method according to claims 1, 2, 4, 5 or 3 wherein an additional component of said composite is aluminum metal.

9. A method for polishing an integrated circuit whose surface is comprised of metal and silica in which a polishing composition comprising: an aqueous medium, abrasive particles, an oxidizing agent and a compound or compounds which suppress the rate of removal of silica, wherein each of said compound or compounds contains at least two acid groups and where the pKa of the first dissociable acid is not substantially larger than the pH of the polishing composition is used as the polishing slurry.

10. A method according to claim 9 where said compound or compounds which suppress the rate of removal of silica contain a benzene ring.

11. A method according to claim 10 where said composition for polishing consists essentially of water, abrasive particles, hydrogen peroxide and potassium hydrogen phthalate, where the solution concentration of the phthalate component is at least 0.1 molar.

12. A method according to claim 9 where said compound or compounds which suppress the rate of removal of silica are straight chain mono- and dicarboxylic acids and salts which have secondary hydroxyl groups in an alpha position relative to the carboxylate group.

13. A method according to claim 9 where said compound or compounds which suppress the rate of removal of silica are tri or poly-carboxylic acids and salts which have secondary or tertiary hydroxyl groups in an alpha position relative to a carboxylate group.

14. A method according to claims 9, 10, 12, 13 or 11 wherein a component of the integrated circuit surface to be polished is tungsten metal.

15. A method according to claims 9, 10, 12, 13 or 11 wherein a component of the integrated circuit surface to be polished is copper metal.

16. A method according to claims 9, 10, 12, 13 or 11 wherein a component of the integrated circuit surface to be polished is aluminum metal.

* * * * *